United States Patent
Oh et al.

(10) Patent No.: US 7,551,662 B2
(45) Date of Patent: Jun. 23, 2009

(54) DISTRIBUTED FEEDBACK (DFB) QUANTUM DOT LASER STRUCTURE

(75) Inventors: Dae Kon Oh, Daejeon (KR); Jin Hong Lee, Daejeon (KR); Jin Soo Kim, Daejeon (KR); Sung Ui Hong, Daejeon (KR); Byung Seok Choi, Daejeon (KR); Hyun Soo Kim, Daejeon (KR); Sung Bock Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 12/096,351

(22) PCT Filed: Nov. 24, 2006

(86) PCT No.: PCT/KR2006/004981

§ 371 (c)(1),
(2), (4) Date: Jun. 5, 2008

(87) PCT Pub. No.: WO2007/066916

PCT Pub. Date: Jun. 14, 2007

(65) Prior Publication Data

US 2008/0279243 A1 Nov. 13, 2008

(30) Foreign Application Priority Data

Dec. 6, 2005 (KR) .................. 10-2005-0118139
Jun. 22, 2006 (KR) .................. 10-2006-0056215

(51) Int. Cl.
*H01H 3/08* (2006.01)
*H01S 5/00* (2006.01)

(52) U.S. Cl. .................. 372/96; 372/43.01; 372/98; 372/102

(58) Field of Classification Search .............. 372/43.01, 372/92, 96, 98, 102
See application file for complete search history.

(56) References Cited

U.S. PATENT DOCUMENTS 5,084,894 A * 1/1992 Yamamoto ............... 372/50.22

(Continued)

FOREIGN PATENT DOCUMENTS

JP 2000-286501 10/2000

(Continued)

OTHER PUBLICATIONS

F. Klopf et al., "InAs/GaInAs quantum dot DFB lasers emitting at 1.3μm" Electronics Letters, May 10, 2001, vol. 37, No. 10, pp. 634-636.

*Primary Examiner*—Armando Rodriguez
*Assistant Examiner*—Phillip Nguyen
(74) *Attorney, Agent, or Firm*—Rabin & Berdo, P.C.

(57) ABSTRACT

A distributed feedback (DFB) quantum dot semiconductor laser structure is provided. The DFB quantum dot semi-conductor laser structure includes: a first clad layer formed on a lower electrode; an optical waveguide (WG) formed on the first clad layer; a grating structure layer formed on the optical WG and including a plurality of periodically disposed gratings; a first separate confinement hetero (SCH) layer formed on the grating structure layer; an active layer formed on the first SCH layer and including at least a quantum dot; a second SCH layer formed on the active layer; a second clad layer formed on the second SCH layer; an ohmic layer formed on the second clad layer; and an upper electrode formed on the ohmic layer. Accordingly, an optical WG is disposed on the opposite side of the active layer from the grating structure layer, thereby increasing single optical mode efficiency. And, an asymmetric multi-electrode structure is used for applying current, thereby maximizing purity and efficiency of the single mode semiconductor laser structure.

14 Claims, 3 Drawing Sheets

U.S. PATENT DOCUMENTS

| | | | |
|---|---|---|---|
| 5,614,436 A | | 3/1997 | Shim et al. |
| 5,878,066 A | * | 3/1999 | Mizutani et al. ............... 372/27 |
| 5,991,322 A | * | 11/1999 | Takiguchi et al. ........ 372/50.11 |
| 6,067,312 A | | 5/2000 | Matz et al. |
| 6,252,895 B1 | * | 6/2001 | Nitta et al. .................. 372/50.1 |
| 6,411,640 B1 | * | 6/2002 | Nakanishi .................... 372/96 |
| 6,477,191 B1 | * | 11/2002 | Okada et al. ............. 372/50.11 |
| 6,704,335 B1 | * | 3/2004 | Koyama et al. .......... 372/43.01 |
| 6,728,288 B2 | * | 4/2004 | Funabashi et al. ............. 372/96 |
| 6,788,725 B2 | | 9/2004 | Aoyagi et al. |
| 2003/0016720 A1 | * | 1/2003 | Funabashi et al. ............. 372/96 |
| 2006/0045157 A1 | * | 3/2006 | Ratowsky et al. ........ 372/46.01 |
| 2006/0146902 A1 | * | 7/2006 | Ikoma et al. ............. 372/43.01 |

FOREIGN PATENT DOCUMENTS

| | | |
|---|---|---|
| JP | 2003-037334 | 2/2003 |
| JP | 2003-204114 | 7/2003 |
| JP | 2004-095806 | 3/2004 |
| KR | 1995-0012971 | 5/1995 |
| KR | 2004-0032375 | 4/2004 |
| WO | WO-2004/109873 | 12/2004 |

* cited by examiner

[Fig 1]
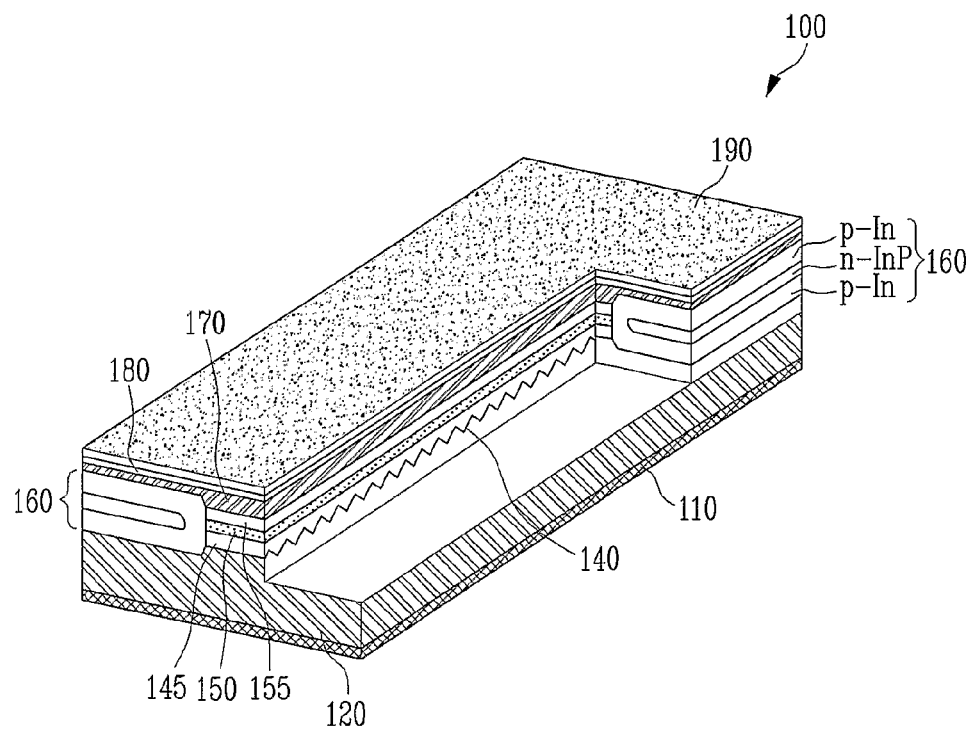
[Fig 2]
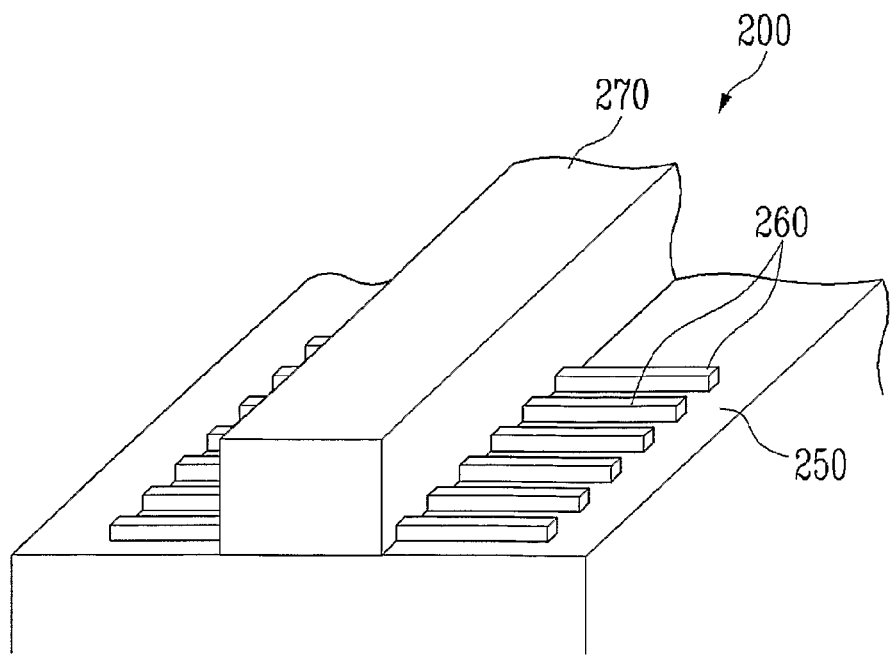

[Fig 3]
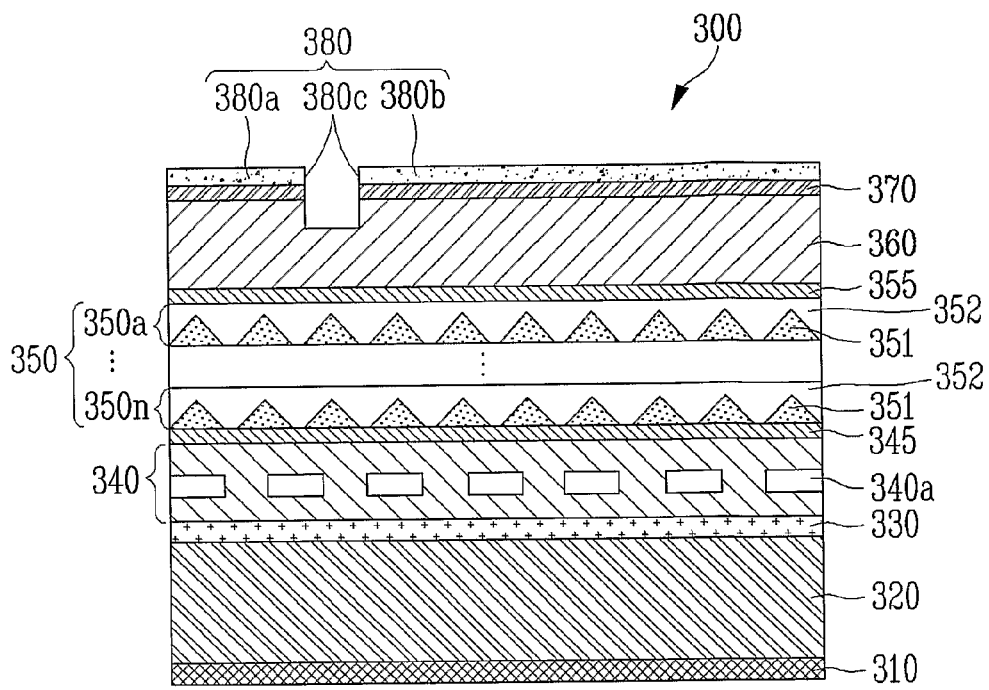
[Fig 4]
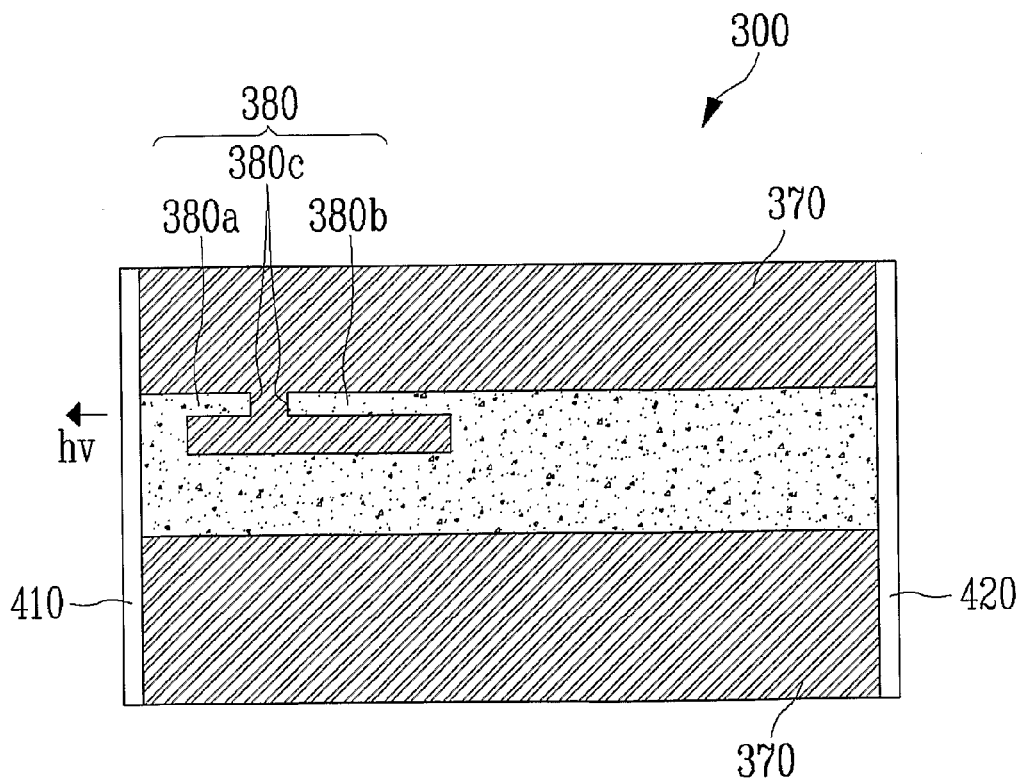

[Fig 5]
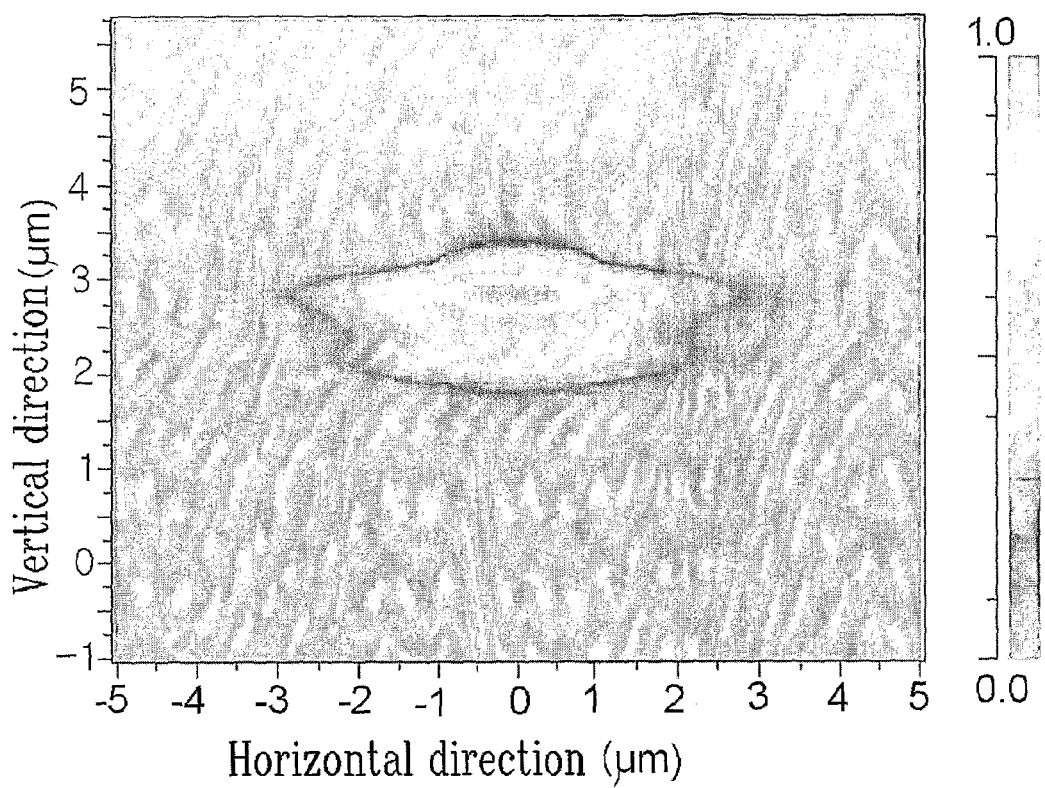

DISTRIBUTED FEEDBACK (DFB) QUANTUM DOT LASER STRUCTURE

TECHNICAL FIELD

The present invention relates to a distributed feedback (DFB) quantum dot laser structure, and more particularly, to a distributed feedback (DFB) quantum dot laser structure disposing an optical waveguide on the opposite side of an active layer from a grating structure to produce a single optical mode.

BACKGROUND ART

Recently, in response to rapidly increasing demand in communications, a wavelength division multiplexing (WDM) optical communication system which can expand communication capacity without laying more fibers by transmitting optical signals at different wavelengths through one fiber is being developed. A DFB quantum dot laser that can output a single wavelength is employed in the WDM optical communication system.

A quantum dot laser may be simply implemented by forming an electro-optic conversion layer of an active layer to have a zero-dimensional quantum dot structure instead of a conventional bulk or quantum well structure. However, most practical quantum dots are formed by self-assembly. Accordingly, when an active layer is formed using a quantum dot, power that is locally distorted due to a certain percentage of lattice mismatch is included in the active layer.

A conventional DFB quantum dot laser structure will now be described with reference to the drawings.

FIG. 1 is a partially cut-away perspective view illustrating a conventional DFB quantum dot laser structure. Referring to FIG. 1, the conventional DFB quantum dot laser structure 100 includes a pair of electrodes 110 and 190 disposed on its top and bottom, an active layer 150 including a plurality of quantum dots (not illustrated), and a diffraction grating 140 disposed below the active layer 150. Also, the DFB quantum dot laser structure 100 includes an InP substrate 120 disposed on the lower electrode 110, a first light guide 145 adjacent to the diffraction grating 140, a second light guide 155 disposed on the active layer 150, and a current blocking layer 160 disposed at both sides of the active layer 150, and the first and second light guides 145 and 155. The current blocking layer 160 includes p-In, n-InP, p-In. Also, the DFB quantum dot laser structure 100 further includes a clad layer 170 disposed on both the active layer 150 and the current blocking layer 160, and a cap layer 180 (an ohmic layer) disposed on the clad layer 170.

As shown in FIG. 1, when the diffraction grating 140 is disposed below the active layer 150 in order to produce a single light source, formation of a quantum dot constituting the active layer 150 may be adversely affected by a non-planarized surface due to unevenness of the diffraction grating 140.

To resolve this problem, a space layer comprising a binary compound, i.e., InP, may be deposited to a predetermined thickness prior to forming a quantum dot, so as to ensure a planarized surface. However, when the space layer is formed below the active layer, since an optical mode formed in the active layer is far from the diffraction grating in optical coupling, single mode purity may be reduced by a small optical coupling constant in spite of a sufficiently long length of a resonance layer.

FIG. 2 is a partially cut-away enlarged view of a metal diffraction grating formed on a substrate of a conventional quantum dot laser structure. The quantum dot laser structure 200 shown in FIG. 2 includes an active layer 250 disposed on a substrate (not illustrated), a plurality of metal diffraction gratings 260 disposed on the active layer 250, and a waveguide 270 disposed on the metal diffraction gratings 260. Here, the metal diffraction gratings 260 are vertically optically coupled to the top of the active layer 250, and the waveguide 270 is perpendicular to the metal diffraction gratings 260.

When an experiment for making a light source is performed with the quantum dot semiconductor laser structure 200 having such a structure, a high-purity single mode light source is made. However, to form the metal diffraction gratings 260 shown in FIG. 2, electron beam lithography should be used instead of conventional UV photo-lithography. Thus, production cost and time may increase, thereby decreasing mass-productivity.

Also, the quantum dot laser structures 100 and 200 shown in FIGS. 1 and 2 should employ a long resonator whose length reaches the millimeter level because of the small volume of a gain material compared to a semiconductor laser using a conventional quantum well structure. Accordingly, it may not be easy to stably obtain a single mode due to local carrier saturation and hole burning phenomena.

To overcome this problem, a quantum dot laser having a high quantum dot surface density, which is one of a GaAs series having a wavelength band centered at 1.3 μm or less and an InP series having a wavelength band centered at 1.55 μm, may be employed. The GaAs series quantum dot laser structure uses a resonator having a length of about 300 μm like the conventional quantum well structure, so the structure can show relatively stable optical characteristics. However, since the InP series quantum dot laser structure uses a long resonator whose length is 1 mm or more, it is not easy to stably implement an optical mode.

As another structure for resolving this problem, a multi-electrode structure in which a gain region is separated from an optical waveguide region or a phase controlling region has been suggested. However, in such a structure, the diffraction grating part should be separated, which complicates a manufacturing process and decreases yield. And, a current source should vary depending on region, which complicates module production and increases power consumption.

DISCLOSURE OF INVENTION

Technical Problem

The present invention is directed to a distributed feedback (DFB) quantum dot laser structure which can increase optical coupling efficiency, simplify a manufacturing process, and improve single optical mode purity, by forming an optical waveguide on the opposite side of an active layer from a diffraction grating.

The present invention is also directed to a DFB quantum dot laser structure in which an upper electrode structure is separated into two parts so as to reduce inefficiency such as local carrier saturation and hole burning, and to obtain stable single mode purity.

Technical Solution

One aspect of the present invention provides a distributed feedback (DFB) quantum dot laser structure comprising: a first clad layer formed on a lower electrode; an optical waveguide (WG) formed on the first clad layer; a grating structure layer formed on the optical WG and including a plurality of periodically disposed gratings; a first separate confinement hetero (SCH) layer formed on the grating structure layer; an active layer formed on the first SCH layer and including at least a quantum dot; a second SCH layer formed on the active layer; a second clad layer formed on the second SCH layer; an ohmic layer formed on the second clad layer; and an upper electrode formed on the ohmic layer.

The optical WG may be formed of an InGaAsP semiconductor having a wavelength bandgap of about 1.3 to 1.5 μm. The optical WG may be formed to a thickness of about 0.1 to 0.3 μm. An interval between the optical WG and the grating may be about 0.05 to 0.3 μm. While when the interval is less than 0.05 μm, downward mobility and size expansion effects of an optical mode may be relatively degraded, when the interval is more than 0.3 μm, the optical mode may be separated into two modes in a space, thereby deteriorating optical mode characteristics.

The upper electrode may comprise two asymmetrically separated electrodes which are spaced a predetermined distance apart. The distance may be about 2 to 50 μm, a ratio of asymmetry of the two separated electrodes may be in the range of 2 to 10, and the shorter of the two electrodes may be disposed at a side of a laser emission surface. The two separated electrodes may be connected to at least one region of each other, thus enabling simultaneous application of current to the two separated electrodes from a single current source.

The active layer may have a multi-layer structure, each layer having a plurality of quantum dots. The active layer may comprise an In(Ga)As quantum dot layer, and an InGaAsP or InAlGaAs barrier layer. The quantum dot may have a structure having a bandgap wavelength of about 1.55 μm. The grating structure layer may use InGaAs which is lattice-matched to InP of the second clad layer. The grating may have a thickness of about 20 to 50 nm. The first and second SCH layers may have a bandgap composition of 1.1 to 1.2 μm, and the first SCH layer may be relatively thicker than the second SCH layer. The first SCH may be formed to a thickness of about 100 to 150 nm.

Advantageous Effects

As described above, an optical waveguide may be formed below a diffraction grating, that is, on the opposite side of an active layer from the grating structure layer, thereby maintaining high-performance characteristics which are advantages of a quantum dot semiconductor laser structure, i.e., a high-temperature operation characteristic, wavelength stability over a wide range of temperatures, high-speed direct modulation, a low noise index, etc., increasing optical coupling efficiency, simplifying a manufacturing process, and improving single optical mode purity.

Also, an upper electrode structure may be separated into two parts, that is, the upper electrode may be asymmetrically separated into two electrodes spaced apart by a gap, and current may be applied to each electrode so as to reduce inefficiency such as local carrier saturation and hole burning, to obtain stable single mode purity, and to improve yield.

BRIEF DESCRIPTION OF THE DRAWINGS

FIG. 1 is a partially cut-away perspective view illustrating a DFB quantum dot laser structure according to conventional art;

FIG. 2 is a partially cut-away enlarged view of a metal diffraction grating formed on a substrate of a quantum dot laser structure according to conventional art;

FIG. 3 is a schematic view of a distributed feedback (DFB) quantum dot laser structure according to an exemplary embodiment of the present invention;

FIG. 4 illustrates an upper electrode of a DBF quantum dot laser structure of the present invention; and FIG. 5 is a view of an optical mode according to a DBF quantum dot laser structure of the present invention.

DESCRIPTION OF MAJOR SYMBOL IN THE ABOVE FIGURES

300: Distributed feedback quantum dot semiconductor laser structure
310: Lower electrode 320: First clad layer
330: Optical waveguide 340: Grating structure layer
340a: Gratings 360: Second clad layer
345 and 355 : First and second separate confinement hetero structures
350: Active layer 351: Quantum dot layer
352: Barrier layer 370: Ohmic layer
380 : Upper electrode 380a: First upper electrode
380b: Second upper electrode 380c: Phase controlling part

MODE FOR THE INVENTION

Hereinafter, a quantum dot laser structure according to the exemplary embodiments of the present invention will be described in detail with reference to the attached drawings.

FIG. 3 is a schematic view of a distributed feedback (DFB) quantum dot laser structure according to an exemplary embodiment of the present invention. Referring to FIG. 3, the DFB quantum dot laser structure 300 includes lower and upper electrodes 310 and 380, first and second clad layers 320 and 360, an optical waveguide 330, a plurality of gratings 340a, a grating structure layer 340 functioning as a diffraction grating, an active layer 350, and first and second separate confinement hetero (SCH) layers 345 and 355 having the active layer 350 interposed therebetween to function as a light guide.

In order to fabricate the DFB quantum dot laser structure 300 according to the present invention, first, the lower electrode 310, which is an n-type metal layer in the present embodiment, is formed. The first clad layer 320 is formed on the lower electrode 310. The first clad layer 320 is the same type as the lower electrode 310, and thus is an n-type clad layer, which is an InP-type clad layer here.

The optical waveguide (WG: 330) is formed on the first clad layer 320. The optical WG 330 is formed of an InGaAsP semiconductor having a wavelength bandgap of about 1.3 to 1.5 μm, and is formed to a thickness of about 0.1 to 0.3 μm. The grating structure layer 340 functioning as a diffraction grating and including the plurality of gratings (340a) that are periodically spaced a predetermined distance apart is formed on the optical WG 330. The grating structure layer 340 is formed of InGaAs lattice-matched to InP of the first clad layer 320, and the gratings 340a are formed to a thickness of about 20 to 50 nm. The gratings 340a are spaced about 0.05 to 0.3 μm apart from the optical WG 330.

Next, the first SCH layer 345 functioning as a light guide is formed on the grating structure layer 340, and the active layer 350 having the multi-layer structure 350a to 350n and including at least one quantum dot is formed on the first SCH layer 345. Each layer 350a to 350n constituting the active layer 350 has a plurality of quantum dots. Alternatively, the active layer 350 may include a single quantum dot. Each layer 350a to 350n constituting the active layer 350 of FIG. 3 includes an In(Ga)As quantum dot layer 351 having a bandgap wavelength of about 1.55 μm, and an InGaAsP or InAlGaAs barrier layer 352. The second SCH layer 355 functioning as a light guide is formed on the active layer 350.

The first and second SCH layers 345 and 355 have a bandgap composition of an about 1.1 to 1.2 μm, and the first SCH layer 345 is relatively thicker than the second SCH layer 355. Here, the first SCH layer 345 is formed to a thickness of about 100 to 150 nm, and the second SCH 355 is thinner than the first SCH layer 354. Accordingly, the second SCH layer 355 may be formed to a thickness of 100 nm or less, and here, about 50 to 100 nm.

The second clad layer 360, which is a p-type clad layer, is formed on the second SCH layer 355. An ohmic layer 370 that can control a phase is formed on the second clad layer 360. The upper electrode 380 is formed on the ohmic layer 370, which is a p-type metal layer.

As described above, the DFB quantum dot laser structure even adopts the grating structure layer 340 having a diffraction grating structure, and disposes the optical WG 330 below the active layer 350 so that the central axis of the optical mode formed on the active layer 350 can move toward the diffraction grating, even when the layers formed on the diffraction grating structure, i.e., gratings, for planarization are formed thickly. Thus, optical coupling efficiency with the diffraction grating structure increases, and high purity of a single mode may be obtained. The location and thickness of the optical WG 330 formed below the grating structure layer 340, which is a diffraction grating structure layer, may be controlled so as to expand the size of the optical mode, thereby increasing optical coupling efficiency with external optical fiber and reducing production cost of an optical module.

Meanwhile, the upper electrode 380 in the present exemplary embodiment has an asymmetrically separated structure including a first upper electrode 380a, a second upper electrode 380b, and a phase controlling part 380c which is a gap between the upper electrodes 380a and 380b. The structure of the upper electrode 380 will be described in detail with reference to FIG. 4, which is a plan view illustrating an upper electrode of a DFB quantum dot laser structure according to the present invention.

FIG. 4 illustrates a structure that simplifies a manufacturing process and unifies current sources. In the exemplary embodiment, the upper electrode 380 is an asymmetrically separated electrode including a first upper electrode 380a, a second upper electrode 380b, and a phase controlling part 380c which is a gap between the upper electrodes 380a and 380b. Also, a distance between the first and second upper electrodes 380a and 380c is about 2 to 50 μm, and a ratio of asymmetry between the first and second upper electrodes 380a and 380b is about 2 to 10. The shorter upper electrode 380a is formed at a side of a laser emission surface 410, and the longer upper electrode 380b is formed at a side of a region 420 with high reflectivity.

Since the two electrodes 380a and 380b are connected with a bridge, current can be simultaneously applied to the two electrodes 380a and 380b through a single current source. Such a current applying structure may be manufactured by lightly trench-etching parts of an InGaAs resistance contact layer and an InP clad layer right before a step of forming a last p-type metal in a final chip manufacturing process. In addition, the size of the gap between the electrodes, asymmetrical position, and asymmetry ratio may be experimentally determined after designing a mask for individual optimization.

As described above, the upper electrode 380 is separated into two parts, that is, two asymmetrical electrodes are separated by a gap so as to apply current to each electrode, and thus stable single mode purity may be obtained due to local carrier saturation and hole burning.

FIG. 5 is a computer generated image of an optical mode simulation according to a DBF quantum dot laser structure of the present invention. In FIG. 5, the optical mode is simulated by computer in order to optimize the structure and effect of an optical WG.

In FIG. 5, an optical WG is formed to a thickness of 0.2 μm, and an interval between a lower part of a diffraction grating structure and the optical WG is varied. Here, as the interval between the diffraction grating structure (gratings) and the optical WG is increased, the size of an optical mode and coupling efficiency gradually increase. However, when the interval is 0.3 μm or more, the coupling efficiency is reduced and the optical mode is separated into two parts. Accordingly, the interval between the diffraction grating structure and the optical WG may be maintained at about 0.2 μm in order to optimize optical coupling efficiency and optical mode size.

While the invention has been shown and described with reference to certain exemplary embodiments thereof, it will be understood by those skilled in the art that various changes in form and details may be made therein without departing from the spirit and scope of the invention as defined by the appended claims.

The invention claimed is:

1. A distributed feedback (DBF) quantum dot laser structure, comprising:
   a first clad layer formed on a lower electrode;
   an optical waveguide (WG) formed on the first clad layer;
   a grating structure layer formed on the optical WG and including a plurality of periodically disposed gratings;
   a first separate confinement hetero (SCH) layer formed on the grating structure layer;
   an active layer formed on the first SCH layer and including at least a quantum dot;
   a second SCH layer formed on the active layer;
   a second clad layer formed on the second SCH layer;
   an ohmic layer formed on the second clad layer; and
   an upper electrode formed on the ohmic layer.

2. The DFB quantum dot laser structure of claim 1, wherein the optical WG is formed of an InGaAsP semiconductor having a wavelength bandgap of about 1.3 to 1.5 μm.

3. The DFB quantum dot laser structure of claim 2, wherein the optical WG is formed to a thickness of about 0.1 to 0.3 μm.

4. The DFB quantum dot laser structure of claim 1, wherein the interval between the optical WG and the gratings is about 0.05 to 0.3 μm.

5. The DFB quantum dot laser structure of claim 1, wherein the upper electrode comprises two asymmetrically separated electrodes which are spaced a pre-determined distance apart.

6. The DFB quantum dot laser structure of claim 5, wherein the predetermined distance is about 2 to 50 μm.

7. The DFB quantum dot laser structure of claim 5, wherein a ratio of asymmetry between the two separated electrodes is in the range of about 2 to 10, and the shorter of the two separated electrodes is disposed at a side of a laser emission surface.

8. The DFB quantum dot laser of claim 5, wherein the two separated electrodes are connected to at least one region of each other, thus enabling simultaneous application of current to the two separated electrodes from a single current source.

9. The DFB quantum dot laser structure of claim 1, wherein the active layer has a multi-layer structure including an In(Ga)As quantum dot layer and an InGaAsP or InAlGaAs barrier layer.

10. The DFB quantum dot laser structure of claim 9, wherein the quantum dot layer has a bandgap wavelength of about 1.55 μm.

11. The DFB quantum dot laser structure of claim 1, wherein the grating structure layer uses InGaAs which is lattice-matched to InP of the first clad layer.

12. The DFB quantum dot laser structure of claim 1, wherein the grating has a thickness of about 20 to 50 μm.

13. The DFB quantum dot laser structure of claim 1, wherein each of the first and second SCH layers has a bandgap composition of about 1.1 to 1.2 μm, and the first SCH layer is relatively thicker than the second SCH layer.

14. The DFB quantum dot laser structure of claim 13, wherein the first SCH layer has a thickness of about 100 to 150 nm.

* * * * *